(12) United States Patent
Enichlmair et al.

(10) Patent No.: US 8,227,882 B2
(45) Date of Patent: Jul. 24, 2012

(54) LIGHT-SENSITIVE COMPONENT WITH INCREASED BLUE SENSITIVITY, METHOD FOR THE PRODUCTION THEREOF, AND OPERATING METHOD

(75) Inventors: Hubert Enichlmair, Graz (AT); Jochen Kraft, Oberaich (AT); Bernhard Löffler, Gleisdorf (AT); Gerald Meinhardt, Graz (AT); Georg Röhrer, Graz (AT); Ewald Wachmann, Kainbach (AT)

(73) Assignee: austriamicrosystems AG, Unterpremstätten (DE)

( * ) Notice: Subject to any disclaimer, the term of this patent is extended or adjusted under 35 U.S.C. 154(b) by 1065 days.

(21) Appl. No.: 11/884,805

(22) PCT Filed: Jan. 31, 2006

(86) PCT No.: PCT/EP2006/000825
§ 371 (c)(1),
(2), (4) Date: Jun. 24, 2008

(87) PCT Pub. No.: WO2006/087096
PCT Pub. Date: Aug. 24, 2006

(65) Prior Publication Data
US 2008/0277749 A1    Nov. 13, 2008

(30) Foreign Application Priority Data

Feb. 18, 2005  (DE) .......................... 10 2005 007 710
Feb. 24, 2005  (DE) .......................... 10 2005 008 508
Jun. 6, 2005   (DE) .......................... 10 2005 025 937

(51) Int. Cl.
*H01L 31/0232* (2006.01)

(52) U.S. Cl. ... 257/432; 257/186; 257/462; 257/E31.069
(58) Field of Classification Search .................. 257/186, 257/432, 462, E31.069
See application file for complete search history.

(56) References Cited

U.S. PATENT DOCUMENTS

| | | | |
|---|---|---|---|
| 4,107,722 A | | 8/1978 | Chamberlain |
| 4,926,231 A | * | 5/1990 | Hwang et al. ................. 257/458 |
| 4,968,634 A | | 11/1990 | Kuhlmann |
| 6,359,323 B1 | | 3/2002 | Eom et al. |
| 6,417,058 B1 | * | 7/2002 | Richardson et al. .......... 438/312 |

(Continued)

FOREIGN PATENT DOCUMENTS

EP       0296371 B1    5/1988

(Continued)

OTHER PUBLICATIONS

J. Popp et al., "10 Gbit/s On-Chip Photodetection with Self-Aligned Silicon Bipolar Transistors", Proceedings of the European Solid State Device Research Conference (ESSDERC), Nottingham, Sep. 10-13, 1990, pp. 571-574.

(Continued)

*Primary Examiner* — David Vu
*Assistant Examiner* — Brandon Fox
(74) *Attorney, Agent, or Firm* — Cozen O'Connor

(57) ABSTRACT

A light-sensitive component which has a semiconductor junction between a thin relatively highly doped epitaxial layer and a relatively lightly doped semiconductor substrate. Outside a light incidence window, an insulating layer is arranged between epitaxial layer and semiconductor substrate. In this case, the thickness of the epitaxial layer is less than 50 nm, with the result that a large proportion of the light quanta incident in the light incidence window can be absorbed in the lightly doped semiconductor substrate.

26 Claims, 8 Drawing Sheets

U.S. PATENT DOCUMENTS

| | | | |
|---|---|---|---|
| 6,806,554 B2 * | 10/2004 | Hsu | 257/565 |
| 6,953,925 B2 * | 10/2005 | Fang et al. | 250/214.1 |
| 7,192,838 B2 * | 3/2007 | Steinmann et al. | 438/313 |
| 7,211,829 B2 * | 5/2007 | Yasukawa et al. | 257/79 |
| 7,348,632 B2 * | 3/2008 | Kang et al. | 257/347 |
| 2003/0001235 A1 * | 1/2003 | Hashimoto | 257/592 |
| 2004/0126922 A1 | 7/2004 | Ko et al. | |
| 2004/0256696 A1 * | 12/2004 | Park | 257/565 |
| 2005/0129079 A1 * | 6/2005 | Iwai | 372/50 |

FOREIGN PATENT DOCUMENTS

| | | |
|---|---|---|
| JP | 64-31472 | 2/1989 |
| KR | 2000-44627 | 7/2000 |
| KR | 2003-17690 | 3/2003 |
| WO | WO 2004/049452 | 6/2004 |

OTHER PUBLICATIONS

J.L. Polleux et al., "An SiGe/Si Heterojunction Phototransistor for Opto-Microwave Applications: Modeling and First Experimental Results", 11$^{th}$ GAAS Symposium, Mar. 2003, pp. 231-234.

Sze, S. M., "Physics of Semiconductor Devices", A Wiley-Interscience Publication, John Wiley & Sons, Inc., Second Edition, Chapter 2.3, pp. 74-84, (1981).

De Jong, G. W., et al., "A DC-to-250MHz Current Pre-Amplifier with Integrated Photo-Diodes in Standard CBiMOS, for Optical Storage Systems", International Solid State Circuits Conference 2002, Dig. Tech. Paper, pp. 362-363, p. 474, (2002).

* cited by examiner

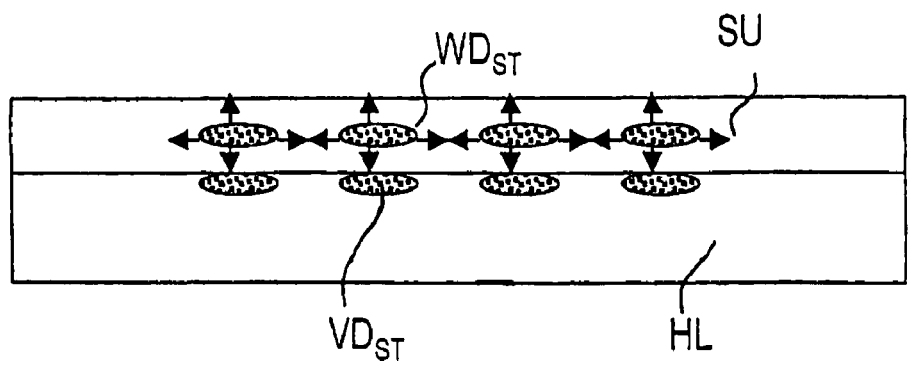
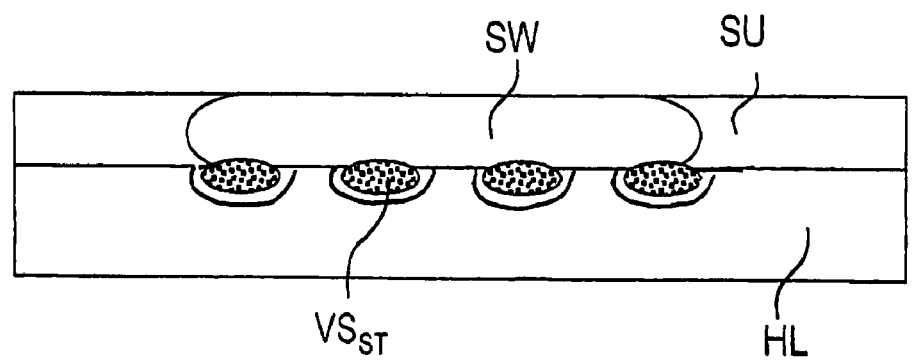
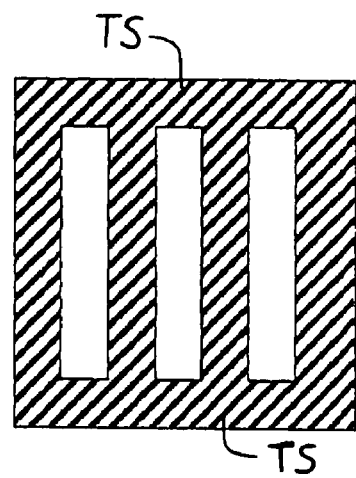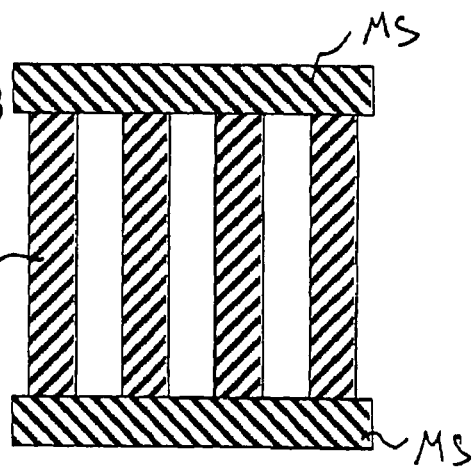
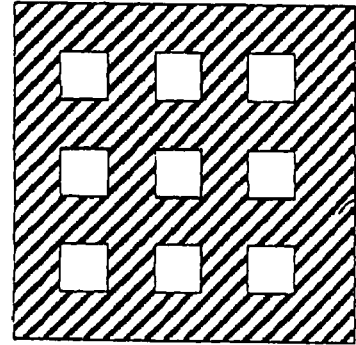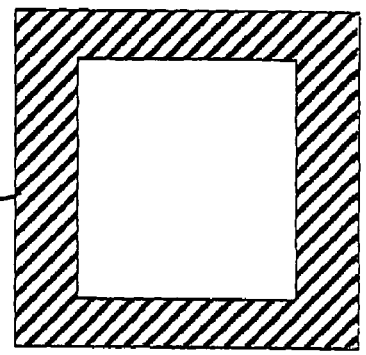

LIGHT-SENSITIVE COMPONENT WITH INCREASED BLUE SENSITIVITY, METHOD FOR THE PRODUCTION THEREOF, AND OPERATING METHOD

RELATED APPLICATIONS

This is a U.S. national stage of application No. PCT/EP2006/000825, filed on 31 Jan. 2006.

This patent application claims priority of German patent application no. 10 2005 007 710.2, filed 18 Feb. 2005, German patent application no. 10 2005 008 508.3 filed 24 Feb. 2005 and German patent application No. 10 2005 025 937.5, filed 6 Jun. 2005, the disclosure content of all of which is hereby incorporated by reference.

FIELD OF THE INVENTION

Semiconductor components can be used for detecting light, examples of such components being photodiodes or phototransistors. What is common to these components is that they have a pn junction around which forms a space charge zone that can be enlarged by means of a correspondingly applied external voltage. Light absorbed by the semiconductor body generates charge carrier pairs there which are separated in the electric field of the space charge zone and forwarded to corresponding external contacts. Charge carrier pairs generated outside the space charge zone reach the region of the electric field only after diffusion and hence significantly more slowly.

Silicon, for example, can be used as semiconductor material for light-sensitive semiconductor components, particularly if the components are integrated with integrated circuits. However, the absorption spectrum of silicon has an increasing absorption toward shorter-wave light. A consequence of this is that incident light in the range up to a wavelength of approximately 460 nm has only a small penetration depth into the silicon. This has the effect that said light is already virtually completely absorbed in the semiconductor in a depth of approximately 80 nm. Therefore, for detecting such short-wave light, the semiconductor is only available to this penetration depth.

What is disadvantageous about this fact is that known light-sensitive semiconductor components usually have a vertically oriented semiconductor junction and have a highly doped layer as the topmost layer in order to realize the semiconductor junction. In this highly doped layer near the surface, however, charge carrier separation can only be effected with a reduced yield since, due to the high charge carrier concentration, the lifetime of the minority charge carriers is short and, on the other hand, the electric field of the space charge zone cannot extend over the entire highly doped layer, with the result that minority charge carriers generated there can only pass to the corresponding current-discharging contact by means of diffusion. However, this process is slow, increases the decay time of the photocurrent and additionally increases the probability of charge carrier pairs recombining and therefore no longer being able to contribute to the signal current of the component.

In order to increase the blue sensitivity of light-sensitive semiconductor components comprising silicon, various approaches have already been pursued. U.S. Pat. No. 4,107,722 A proposes producing, in a semiconductor body, in a zone of the first conductivity type, a highly doped thin layer near the surface of the same conductivity type but with a different dopant. Alongside the actual semiconductor junction with a zone of the second conductivity type, in this way a second semiconductor junction is produced, which generates a weak internal electric field that can additionally accelerate the charge carriers. However, said field is significantly smaller than the field that is formed in the space charge zone or applied externally to the space charge zone. The speed of charge separation is therefore an order of magnitude lower than within the space charge zone. A consequence of this is that the component reacts to light incidence only sluggishly or requires a long decay phase until the last charge carrier pairs can be discharged at the contacts.

U.S. Pat. No. 4,968,634 A discloses firstly producing a flat doping in the surface of a semiconductor body and subsequently etching it back to the location of the highest charge carrier concentration. As a result, the layer thickness of the highly doped layer is reduced and the proportion of charge carrier pairs generated in said layer is reduced.

What is common to most of the approaches for increasing the blue sensitivity of semiconductor components is that they either have a reduced light sensitivity and/or require a slow decay time, which make the component slow. Such components are not suitable for the sensitive detection of light pulses having high pulse rates.

SUMMARY OF THE INVENTION

It is an object of the present invention to specify a light-sensitive component with which blue visible light, too, can be detected sensitively and rapidly.

A basic idea of the invention is to construct a structure similar to a bipolar transistor having a thin epitaxial base, and to utilize the space charge zone at the semiconductor junction between base and collector for absorbing light quanta. In this case, on the light incidence side, the emitter can be entirely dispensed with or it is possible to provide small emitter structures relative to the base.

A light-sensitive component has a component body comprising a lightly doped semiconductor substrate, a substrate well provided therein and doped with a dopant of the second conductivity type, an insulating layer bearing thereon and having a light incidence window, an epitaxial layer arranged on the surface of the semiconductor substrate at least in the light incidence window and doped relatively highly with a dopant of the first conductivity type.

A semiconductor junction is formed between the epitaxial layer and the substrate well. The epitaxial layer has a thickness of less than 80 nm, preferably less than 50 nm.

The light-sensitive component proposed has the advantage that the doping of an epitaxially grown layer can be set reliably and accurately during growth, such that high dopant concentrations are possible. Moreover, unlike the doping of a zone doped by implantation, the doping of an epitaxial layer can be delimited exactly to the epitaxial layer. In this way, a semiconductor junction that is defined sharply and to a confined space can be obtained between semiconductor substrate and thin epitaxial layer.

Moreover, the epitaxial layer is readily controllable in terms of its layer thickness and can be made very thin. The layer thickness of the epitaxial layer is preferably chosen such that it suffices for establishing a minimum field strength for e.g. a given dopant concentration, and that the proportion of light quanta absorbed therein is minimal. The epitaxial layer is preferably highly doped and minimized in terms of its layer thickness. This guarantees that the predominant proportion of the light quanta is absorbed in the significantly more lightly doped semiconductor substrate or the space charge zone established therein, where a low charge carrier density is present and where the probability of recombinations of charge carrier pairs is minimized. This guarantees that a high proportion of the charge carrier pairs generated by the light incidence, accumulated at corresponding contacts, can be made usable as a photocurrent.

The doping of the epitaxial layer is preferably chosen with a magnitude such that a surface charge density of more than $6.6 \times 10^{11}$ cm$^{-2}$ arises. This surface charge density suffices to be able to carry an electric field of at least $10^5$ V/cm in the component body. At this field strength, the charge carriers (electrons and holes) attain their saturation velocity, that is to say the maximum velocity that can be attained in the electric field. A fast response and a fast decay of the photocurrent in the component are obtained with this electric field and the surface charge density required therefor. Since the surface charge density results as the product of the dopant concentration and the layer thickness, complying with the minimum surface charge density with layer thicknesses becoming thinner is possible only with a higher dopant concentration. By way of example, a well-suited layer thickness for the highly doped epitaxial layer is 5 nm, with the result that a dopant concentration of at least $1.3 \times 10^{18}$ cm$^{-3}$ is then required for this.

The component may have a pn structure. A first contact for the discharging or accumulation of the photocurrent is then provided outside the light incidence window in the region of the substrate well at the surface of the semiconductor substrate. For low-impedance discharging, a zone highly doped with a dopant of the second conductivity type or a highly doped connection zone is preferably provided around said well contact.

The doped substrate well may comprise an really delimited region in the semiconductor substrate. However, it is also possible for the substrate well to be formed over the whole area in the upper layer region of the semiconductor substrate.

It is also possible to provide the component with a PIN structure. In this case, the substrate well has no doping or an only very low doping of an arbitrary conductivity type. The semiconductor junction is then produced by means of a buried layer highly doped with a dopant of the second conductivity type. Said buried layer can be produced by a high-energy implant.

However, it is also possible to produce the buried layer near the surface in a semiconductor body, above that to effect epitaxial growth of a lightly doped semiconductor layer, or a semiconductor layer that is not doped at all, and to thermally activate and in the process enlarge the then buried doping zone. The buried layer then extends in the area at least over the entire region below the light incidence window and beyond in order that the highly doped connection zone is linked there in low-impedance fashion both to the buried layer and to the surface. The connection zone can be produced by a doping which is formed as a sinker and which extends from the surface of the semiconductor substrate down to the buried layer.

In parallel with this, or as an alternative to this, the epitaxial layer can be formed in intrinsic fashion in the lower layer region. The epitaxial layer can then also be made thicker. The indications mentioned further above with regard to the advantageous dimensioning and doping then apply only to the highly doped upper region of the epitaxial layer. In the extreme case, the thickness of this highly doped region can be chosen to be so thin that practically only a monolayer is highly doped. The term delta spiking is also employed in this context.

By contrast, the intrinsic lower region of the epitaxial layer can reinforce, or constitute, the intrinsic part of the PIN structure.

The buried layer is also advantageous for a component comprising a pn junction in which a well doping of the second conductivity type is present.

Semiconductor substrate and epitaxial layer comprise a semiconductor, which can be selected from silicon, silicon-germanium or germanium. Preferably, the semiconductor substrate comprises silicon, whereas the epitaxial layer comprises silicon-germanium. The doping of the first conductivity type is a p-type doping, in particular, and that of the second conductivity type is then an n-type doping.

A further improvement with regard to the effectiveness of the charge carrier accumulation in the component is obtained if a doping gradient is set in the epitaxial layer with regard to the dopant of the first conductivity type, which doping gradient accelerates the minority charge carriers toward the semiconductor junction. This is achieved by means of a doping profile in which the doping intensity within the epitaxial layer decreases in the direction of the semiconductor substrate. The layer region having the highest doping is preferably produced such that it is infinitesimally thin. In this way, the accelerating field extends over the entire epitaxial layer, such that minority charge carriers generated therein at an arbitrary location as a result of light incidence and absorption are accelerated toward the semiconductor junction. The transport toward the contacts would otherwise take place exclusively through charge carrier diffusion, which would be significantly slower and entails the risk of recombination.

The light-sensitive component can be operated as a diode. For this purpose, alongside the first contact at the substrate well or at the connection zone, a second contact is provided at the epitaxial layer.

Preferably, the epitaxial layer is applied over the whole area over the insulating layer and the light incidence window. Whereas an epitaxial and thus monocrystalline growth is desired over the light incidence window, the remaining region can also grow in polycrystalline fashion. In order to reduce the electrical series resistance at the electrical connection, the epitaxial layer outside the light incidence window can be caused to acquire low impedance by means of additional doping.

As an alternative, outside the light incidence window below or above the epitaxial layer it is possible to provide a layer having good conductivity, for example a doped polysilicon layer, which undertakes or supports the current transport. This layer can by itself cause the electrical connection of the epitaxial layer to acquire low impedance. It is also possible, from such a highly doped layer, by outdiffusion of the dopants contained therein into the epitaxial layer, to increase the doping thereof in this region. Outside the light incidence window, a metallic connection pad as electrical contact is arranged on the epitaxial layer or an overlying highly doped layer.

The photocurrent generated in the diode is conducted away via the first contact at the connection zone or at the substrate well and the second contact at the epitaxial layer. For support, a BIAS voltage can be applied to the two contacts. However, it is also possible to operate the component without additional BIAS voltage, the charge carrier separation being effected solely by the electric field formed in the space charge zone. In all cases, a very rapidly responding and decaying light-sensitive component is obtained which can be used to measure a photocurrent that essentially also corresponds to the quantity of the charge carrier pairs generated by light incidence.

The thickness of the space charge zone is dependent both through the thickness and doping intensity of the epitaxial layer highly doped with dopant of the first conductivity type and through the distance between the likewise highly doped buried layer and the surface of the semiconductor substrate. Only light absorbed within the space charge zone generates charge carrier pairs which are subjected to a drift in the field and can be accelerated toward the contacts and accumulated reliably and in a desired time window. Since the penetration depth of light increases with the wavelength in silicon, however, the thickness of the space charge zone, as the wavelength increases, must also be made thicker in order to generate enough charge carrier pairs therein and to operate the component with sufficient efficiency.

In a further configuration of the invention, the sensitivity of the component to red light can nevertheless be increased by the space charge zone being at least partly extended into the highly doped buried layer. This is done in a simple manner by the buried layer not being produced as a homogeneous large-area doped zone, but rather being fabricated in patterned fashion in an otherwise weakly doped substrate. The doping of the buried layer is preferably patterned in strip-, lattice- or frame-type fashion. What is essential in this case is that weakly doped substrate remains between the doped regions within this structure, with the result that a horizontally acting field can be established within the buried layer. The space charge zone then extends into these weakly doped regions between the highly doped regions. Consequently, these are also available for the formation of charge carrier pairs which can be generated in the weakly doped zone, be accelerated in the field of the extended space charge zone toward the highly doped regions of the buried layer or toward the highly doped epitaxial layer and be conducted away via the corresponding contacts. In the patterning of the buried layer, a high area proportion of the remaining weakly doped substrate must be weighed against a sufficiently low-impedance connection via the buried layer. In the case of a strip-type patterning, the strips are oriented such that they connect the region below the light inflow window to the connection zone or the region of the first contact in low-impedance fashion. At the ends, the strip-type highly doped zones of the buried layer can be electrically short-circuited via doping strips or metallizations running transversely with respect thereto.

The buried layer is usually produced as a zone having a relatively small thickness by means of an implantation and is activated, and extended in terms of its volume in the process, in a later thermal step. Irrespective of whether the buried layer is firstly produced in the surface of the substrate and subsequently covered with an epitaxial substrate layer or is produced directly in the desired depth by means of depth implantation, it is possible to prevent dopants from diffusing from the substrate well into the only weakly doped regions within the structure by the doping of the substrate well also being patterned in a corresponding manner and for example in strip- or lattice-type fashion. During the activation of the doped zones, this has the effect that the latter firstly combine without diffusing to an excessively great extent into the regions within the structure of the buried layer.

In a further configuration of the component, the region below the buried layer is also used for forming charge carrier pairs and conducting them away at corresponding contacts. For this purpose, a second space charge zone is produced below the buried layer by a positive voltage relative to the semiconductor substrate being applied to the buried layer there. The semiconductor substrate is weakly doped with the first conductivity type. The electric field that forms in said second space charge zone is of opposite polarity to that of the first space charge zone, accelerates the charge carriers toward the buried layer or further downward toward the substrate and from there is conducted to a corresponding substrate contact on the surface of the semiconductor substrate. Suitable dimensioning of the layer thickness of the second space charge zone is achieved by means of a correspondingly weak doping of the semiconductor substrate with the first conductivity type.

In a further configuration of the component, the second space charge zone is also formed without a buried layer. In this case, the doping of the substrate well of the second conductivity type is chosen to be greater than that of the semiconductor substrate of the first conductivity type. In this way, too, two electric fields acting oppositely with regard to their polarity are generated which accelerate the charge carrier pairs generated either toward the substrate contact and toward the first contact or toward the first and toward the second contact, according to where said charge carrier pairs arise. Patterned doping in the form of a lattice or strip pattern is not required for this embodiment. This also makes it possible to increase the layer thickness of the semiconductor layer that can be utilized overall for the absorption of light or for the generation of charge carrier pairs in such a way that a high proportion of the red light can also be detected by means of the component. Overall, therefore, depending on the substrate doping, up to 15 or even 20 μm layer thickness can be utilized for the light incidence and detection.

The sensitivity of the component can be increased if an emitter structure is also additionally arranged above the epitaxial layer and the component is operated as a phototransistor. The emitter structure comprises a patterned further semiconductor layer doped with a dopant of the second conductivity type. The emitter structure can then be applied e.g. in polycrystalline form over the whole area by means of an arbitrary layer producing process. A patterning is subsequently effected in such a way that the emitter structure over the epitaxial layer leads only to minimal shading in the region of the light incidence window.

Therefore, a suitable emitter structure is preferably arranged only in the edge region or in the center of the light incidence window on or above the epitaxial layer. Advantageously, the emitter structure is formed in annularly closed fashion in a manner following the edge of the light incidence window. Inside the annular emitter structure, the epitaxial layer remains unshaded and free of light-absorbing additional semiconductor layers. Both possible patternings have the advantage that the current paths are only short here. The central arrangement has the advantage that the transistor can be formed with a smaller area and therefore with a lower current consumption.

Above the epitaxial layer there may be arranged a dielectric layer—in particular an oxide layer or an oxide/nitride double layer—in which cutouts corresponding to an emitter window are then arranged. The emitter structure can then be deposited selectively therein.

An emitter contact is provided at the emitter structure. The component can thus additionally be operated as a phototransistor. The epitaxial layer serving as the base of the phototransistor can remain freely floating, while a BIAS voltage is applied between the first contact and the emitter contact, which BIAS voltage is reverse-biased with regard to the semiconductor junction between substrate and epitaxial layer, whereas it is forward-biased with regard to the semiconductor junction between epitaxial layer and emitter structure. For an npn transistor, this corresponds to a bias voltage whose negative potential is present at the emitter structure. In such an arrangement and, in particular, with a BIAS voltage applied, each charge carrier pair generated by absorption in the region of the space charge zone leads to a change in the potential of the epitaxial layer functioning as the base. This initiates the transistor action. The photocurrent generated is multiplied by the gain factor of the phototransistor, which is approximately equal to the gain factor of a conventional bipolar transistor having a similar structure. Gain factors of approximately 150 or more can be achieved with the phototransistor. Consequently, with the light-sensitive component operated as a photo-transistor, the sensitivity to incident light quanta can be increased by more than two orders of magnitude compared with a light-sensitive component operated as a photodiode. However, a slightly reduced response speed of the component compared with the photodiode is accepted in return.

It is also possible, however, to operate the component comprising an emitter structure with a base or collector current. If this current or the operating point is set correctly, then it is possible for the speed of the transistor to be increased further. Thus, by way of example, in an exemplary embodiment with a voltage of approximately 0.7 to 0.8 V applied between epitaxial layer and substrate contact, it is possible to obtain a maximum transition frequency (FT frequency) of the transistor. For this purpose, a resistor is connected e.g. between first and second contacts. An electrical potential is applied to the first contact, whereas the emitter contact is connected to ground. The base current can then be set by way of the value of the resistor and the applied potential. Depending on this, a collector current is established whose magnitude is then crucial for the maximum transition frequency that can be achieved.

The proposed light-sensitive component comprising an emitter structure can be equipped with three electrical connections designed for the connections for collector, base and emitter or here in the component for substrate well or buried layer, epitaxial layer and emitter structure. Depending on external interconnection, the component can then be operated either as a fast photodiode or as a sensitive phototransistor.

The invention is explained in more detail below on the basis of exemplary embodiments and the associated figures. The figures serve solely for providing a better understanding of the invention and have therefore been drawn up only schematically and not as true to scale. Identical or identically acting parts are designated by identical reference symbols.

BRIEF DESCRIPTION OF THE DRAWINGS

FIG. 5 shows various patterning possibilities for the buried layer.

DETAILED DESCRIPTION OF THE DRAWINGS

Figure 1:
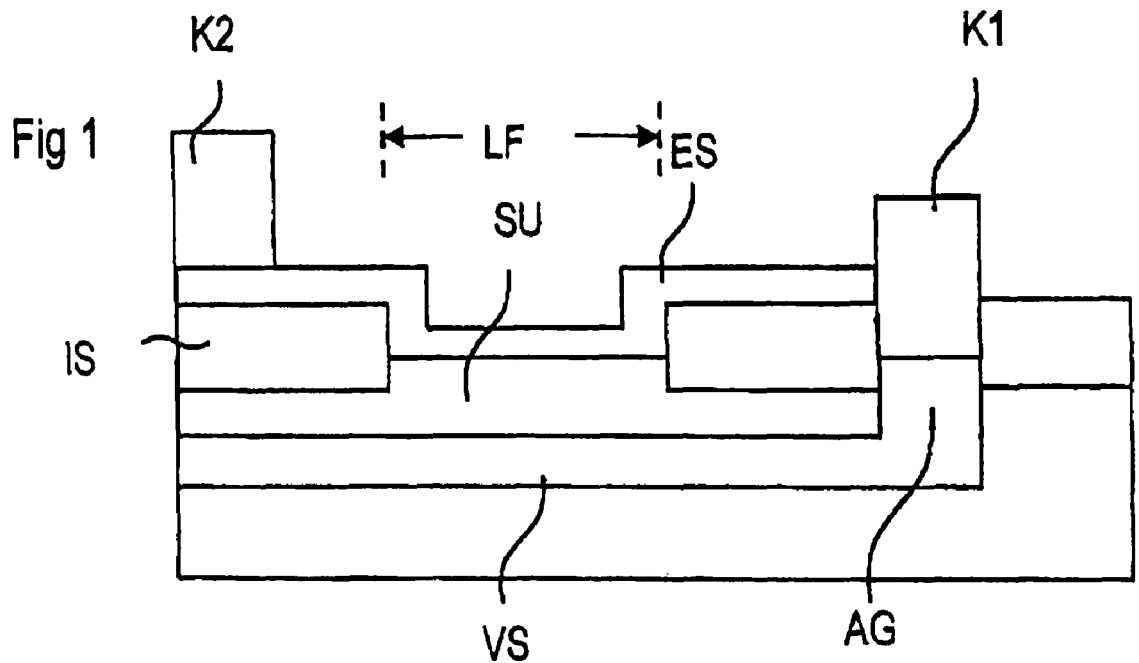
FIG. 1 shows a component that can be operated as a photodiode in schematic cross section.

FIG. 1 shows a light-sensitive component that can be operated as a photodiode in schematic cross section. The component is constructed on a lightly doped semiconductor substrate SU having a doping of the second conductivity type in the upper region. An insulating layer IS, for example a grown field oxide, is arranged above the substrate. However, it is also possible to form the insulating layer around the light incidence window as STI isolation (shallow trench isolation). Above that there may optionally also be arranged a further insulating layer, for example an oxide/nitride double layer, in order for example to insulate the semiconductor substrate SU from the later epitaxial layer outside the STI isolation. Simple patterning is also possible with such a double layer. In the region of a light incidence window LF, the substrate is not covered by the insulating layer IS.

An epitaxial layer ES is arranged above the insulating layer and in a manner covering the light incidence window LF, said epitaxial layer having at least one upper layer region highly doped with a dopant of the first conductivity type. A semiconductor junction is formed between epitaxial layer ES and semiconductor substrate SU. A buried layer VS is furthermore illustrated, which is doped with dopant of the second conductivity type but has a higher doping intensity. Outside the light incidence window LF, a connection zone AG is provided, which is likewise highly doped with dopant of the second conductivity type and which extends from the surface of the semiconductor substrate SU as far as the buried layer VS. This results in a low-impedance connection of the buried layer and thus of the semiconductor substrate by means of a first contact K1. A second contact K2 is arranged on the epitaxial layer ES outside the light incidence window LF. First and second contacts comprise a metallization, for example, in particular a standard metallization of a CMOS or bipolar process sequence such as aluminum, for example.

Figure 2:
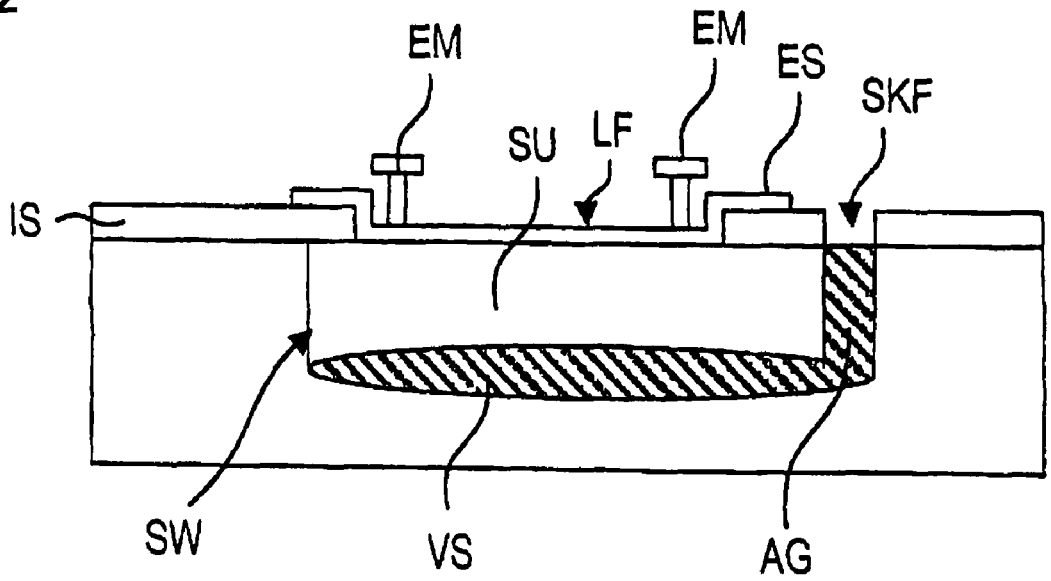
FIG. 2 shows a component that can be operated as a phototransistor in schematic cross section.

FIG. 2 shows a light-sensitive component that can be operated as a phototransistor in schematic cross section. This component, too, has a weakly doped semiconductor substrate SU having a doping of the second conductivity type in the upper region. However, it is also possible to produce in the semiconductor substrate, in the region of the light incidence zone, a weakly doped substrate well SW of the second conductivity type in an oppositely doped semiconductor wafer. An insulating layer IS is situated on the surface of the semiconductor substrate, a light incidence window LF being patterned in said insulating layer. A thin epitaxial layer of the first conductivity type, which has a higher doping than the semiconductor substrate SU, is arranged in a manner bearing on the insulating layer IS and on the semiconductor substrate SU in the region of the light incidence window LF. In the edge region of the light incidence window, an emitter structure EM patterned from a doped semiconductor layer of the second conductivity type is arranged directly on the epitaxial layer ES. It is also possible to produce a dielectric layer above the epitaxial layer, to pattern cutouts therein in which the emitter structure can come into contact with the epitaxial layer, and subsequently to deposit the emitter structure thereabove. This can be effected selectively in the cutouts. However, it is also possible to subsequently pattern one deposited in large-area fashion.

A highly doped connection zone AG is provided outside the light incidence window, said connection zone extending from the surface as far as the buried layer VS, which is arranged in a suitable depth in the semiconductor substrate SU. Here, a doped substrate well SW is provided in the region of the light incidence zone and insulates the active component region below the light incidence window from the rest of the substrate region by means of a blocking semiconductor junction.

The electrical connection of the component that can be operated as a phototransistor is effected by means of a first contact arranged above the connection zone AG in the region of a substrate contact window SKF opened there. A further contact, the emitter contact, is provided on the surface of the emitter structure EM, wherein both contacts may comprise a standard metallization, and in particular aluminum.

In order to produce a component according to FIG. 1 or 2, it is possible to have recourse to standard methods that are used for producing bipolar transistors with a differential base and are known e.g. from WO 2004/049452. For this purpose, a high buried doping VD of the second conductivity type and near the surface is produced by means of implantation, e.g. in a semiconductor body HL, for example having weak doping (e.g. $10^{14}$ cm$^{-3}$) of the first conductivity type. By epitaxial deposition of a substrate layer SU, for example having weak doping (e.g. $10^{14}$ cm$^{-3}$) of the first conductivity type, on the surface of the semiconductor body, the buried doping VD is covered and in the process shifted deeper into the semiconductor (see FIG. 3a).

In the next step, a well doping WD for producing a substrate well SW is introduced in the substrate layer SU, for example by means of implantation and subsequent diffusion. FIG. 3b shows the arrangement at this method stage.

In parallel with this or separately in a thermal step, both the dopant of the buried doping VD and the dopant of the well doping are activated and extended by diffusion to form the substrate well SW and the buried layer VS. The arrangement illustrated in FIG. 3c is obtained in this way.

Figure 3A:
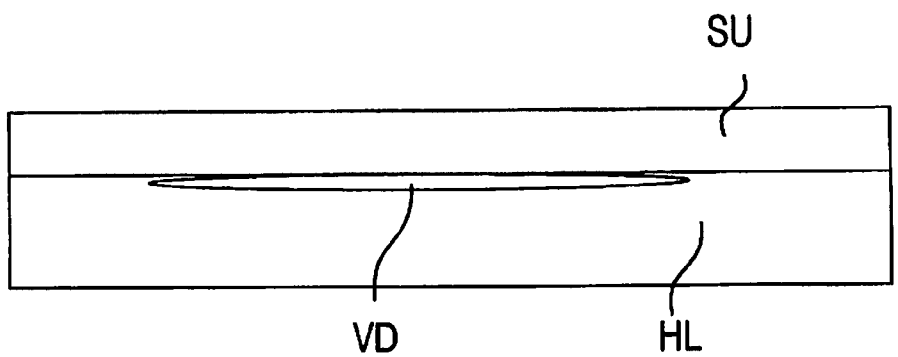
FIG. 3 shows various method stages during the production of the buried layer in schematic cross section.
Figure 3B:
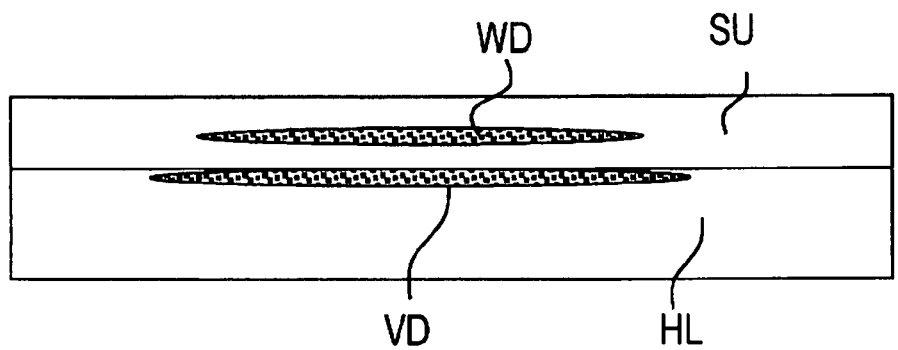
Figure 3C:
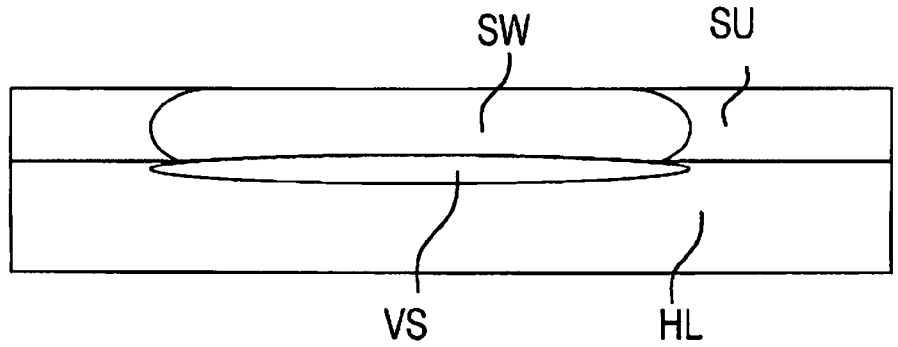
Figure 4A:
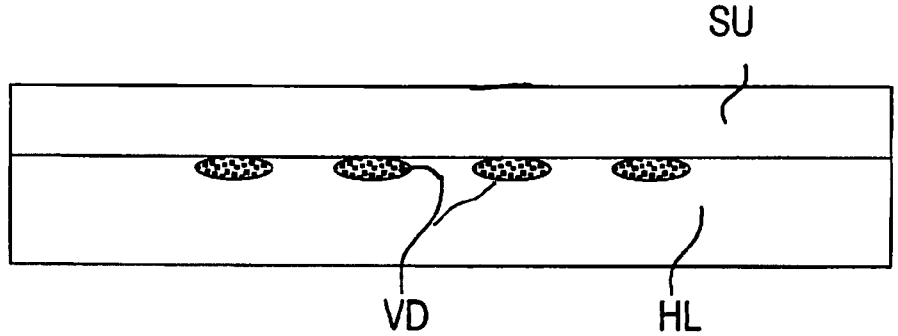
FIG. 4 shows the production of a patterned buried layer.

In a departure from the method steps illustrated in FIG. 3, the buried layer can also be produced in patterned fashion. For this purpose, in a manner similar to that in FIG. 3A, a buried doping $VD_{ST}$ is produced in patterned fashion in the surface of a semiconductor wafer weakly doped with the first conductivity type, for example by implantation by means of a correspondingly patterned mask. A strip-, lattice- or frame-type doping structure can be produced. By means of epitaxial deposition, the buried doping is covered with a substrate layer SU, preferably of the same weak doping of the first conductivity type, as is illustrated in FIG. 4A.

A well doping $WD_{ST}$ is subsequently produced in the substrate layer SU by implantation. As illustrated in FIG. 4B, the well doping is likewise effected in patterned fashion and congruently with respect to the structure of the buried doping. The dopings are subsequently activated, the patterned well doping $WD_{ST}$ coalescing to form a homogeneous substrate well SW by means of correspondingly uniform distribution of the dopant. In this case, an outdiffusion from the patterned buried doping does not take place or takes place only to a small extent if a dopant having relatively low mobility is used for this. By way of example, antimony can be used for the buried doping, and on the other hand phosphorus for the well doping.

FIG. 4C shows the arrangement after activation and diffusion. The now patterned buried layer $VS_{ST}$ is situated below the substrate well SW, which layer has only slightly increased in size as a result of the activation. The weak doping of the first conductivity type of the semiconductor wafer is maintained in a further underlying region.

FIG. 5 shows possible patternings for the buried layer in plan view. In FIG. 5A, the doping of the buried layer is embodied in the form of narrow strips parallel to one another and having a width of 3 μm, for example, with a spacing of 3 μm in each case. At both ends, the strips are connected to one another by a strip TS running transversely with respect thereto.

FIG. 5B likewise shows strip-type dopings, which, however, are connected to one another at the ends by means of metallic webs MS.

FIG. 5C shows a lattice-type patterning of the buried layer, wherein a regular grid of substrate regions having remaining weak doping remains over the entire thickness of the buried layer.

FIG. 5D shows a buried layer patterned in the form of a frame, in which an really larger proportion of weakly doped substrate material remains within the frame, into which substrate material the space charge zone can extend. The frame-type structure in accordance with FIG. 5D is preferred with regard to the accumulation efficiency of charge carrier pairs generated by incident light. The embodiment in accordance with FIG. 5C has the smallest proportion of weakly doped regions within the buried layer, such that, from a relative point of view, the fewest of those charge carriers which are generated within the buried layer can be accumulated with this structure. The structures in accordance with FIGS. 5A and 5B are approximately equivalent with regard to the effectiveness of conducting away charge carriers. The situation is reversed with regard to the series resistance of the buried layer, which is the lowest for the structure in accordance with FIG. 5C, but the largest for the structure in accordance with FIG. 5D.

For the further method steps during the production of the component, it is possible to proceed from prepared substrates in accordance with FIG. 3C or in accordance with FIG. 4C since the structure of the buried layer has no interaction whatsoever with the rest of the production steps. For the sake of simplicity, the figures always illustrate a homogeneous buried layer, but the latter can also be patterned as stated.

The next step involves producing an insulating layer IS, which covers the surface of the semiconductor substrate but omits a, for example rectangular, region of a light incidence window LF. This can be done by growth of a field oxide, for example, the region of the light incidence window being covered by a corresponding mask. It is also possible to deposit an insulating layer in large-area fashion and then to pattern it, or to provide an STI isolation as in the diode embodiment. For patterning the insulating layer, it is possible to use the same mask step that is also used during the production or opening of a base window of an analogous bipolar transistor, which corresponds to the later base/collector contact area. Afterward, in accordance with a first embodiment variant, a conductive layer DS is arranged above the insulating layer IS and patterned in such a way that the light incidence window LF is once again cut out. FIG. 5 shows the arrangement at this method stage.

Figure 6A:
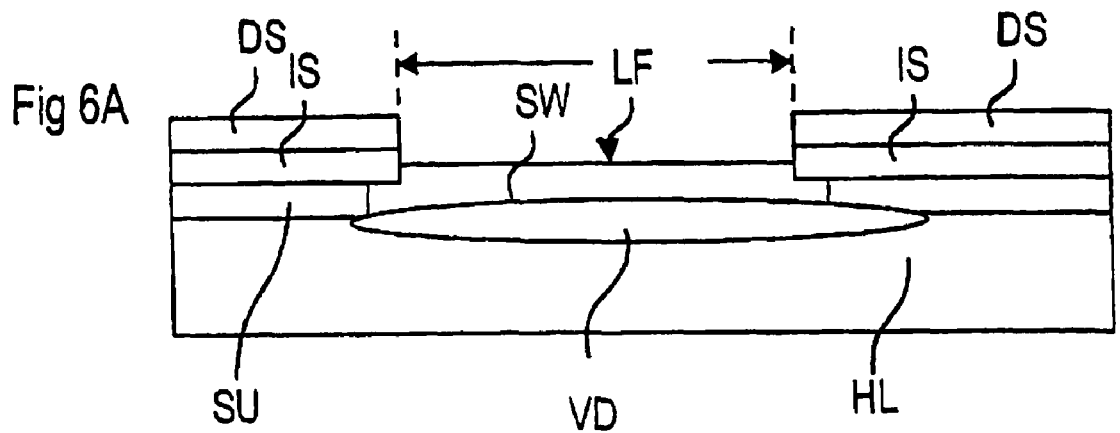
FIG. 6 shows various method stages during the production of the component that can be operated as a photodiode.
Figure 6B:
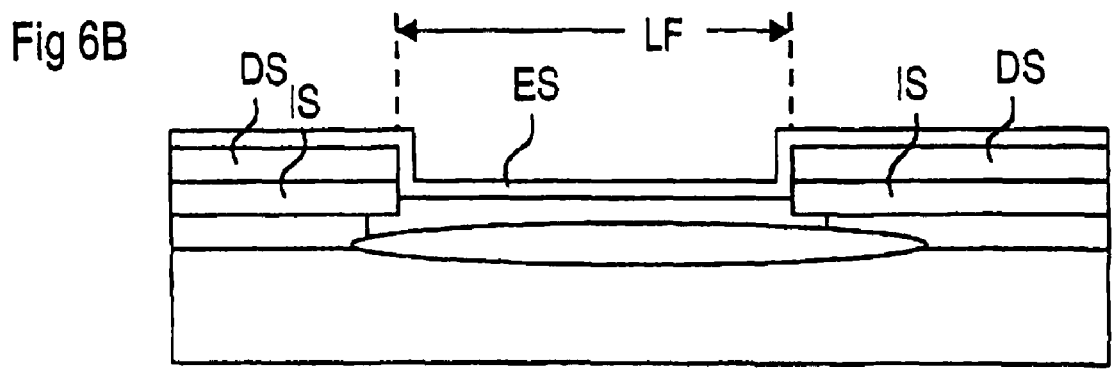

In the next step, an epitaxial layer ES is applied and already doped during the deposition. In this case, the epitaxy is controlled such that the doping within the epitaxial layer acquires an upwardly increasing doping intensity of the first conductivity type and/or a germanium profile in which the germanium content decreases from the bottom toward the top or as the growth thickness increases. FIG. 6 shows the arrangement at this method stage. It is also possible for the epitaxial layer to be highly doped exclusively in its upper layer region. The thickness of the undoped lower region of the epitaxial layer may be e.g. 100 nm, and that of the upper highly doped (after diffusion) may be approximately 30 to 50 nm.

The epitaxial layer ES usually grows in polycrystalline modification above the conductive layer DS, which is made of polysilicon for example, whereas it usually grows in monocrystalline modification in the region of the light incidence window LF.

In order to complete the component, outside the light incidence window LF, the surface of the substrate is uncovered in a substrate contact window SKF (see FIG. 2). A doping for producing a highly doped connection zone AG can subsequently be introduced therein, which doping is led as far as the buried layer VS. A second contact is applied on the surface of the epitaxial layer ES outside the light incidence window LF. Via the highly doped layer DS, dopant can subsequently be diffused into the epitaxial layer outside the light incidence window, a low-impedance connection of the epitaxial layer ES being possible.

The component can be realized completely in silicon. However, it is also possible to provide the substrate layer SU with a germanium doping, in which case a structure similar to a heterojunction bipolar transistor, but without an emitter, is obtained. What is essential is that the emitter layer ES has a high doping in the region of the light incidence window LF, but the substrate SU has a lower doping below the light incidence window. The epitaxial layer ES is additionally applied with a minimal layer thickness which, however, is chosen such that it can carry an electric field of approximately $1 \times 10^5$ V/cm. By way of example, an epitaxial layer having a dopant concentration of at least $1.3 \times 10^{18}/\mathrm{cm}^3$ is suitable.

The thickness of the highly doped epitaxial layer is chosen to be so low that a smallest possible proportion of incident light quanta is absorbed within the epitaxial layer. By way of example, a layer thickness of approximately 50 nm or less is suitable. A semiconductor junction is formed between epitaxial layer ES and semiconductor substrate SU, a space charge zone being established around said semiconductor junction through diffusion of majority charge carriers into the respectively adjacent layer. On account of the low doping of the semiconductor substrate SU there, said space charge zone extends relatively deep approximately as far as the buried layer VS and additionally encompasses a region of the epitaxial layer ES. The buried layer is arranged in a depth in the semiconductor such that the light quanta to be detected or the light quanta in the desired wavelength range are completely absorbed above the highly doped buried layer. For this purpose, longer-wave light may require a semiconductor layer thickness of up to tens of μm, whereas short-wave light may require only a few hundred Å.

If the epitaxial layer ES is e.g. p-doped, then the holes of the charge carrier pairs generated migrate into the epitaxial layer and from there to the second contact, while the electrons generated in parallel are conducted via the buried layer and the connection zone AG to the first contact.

If the component produced up to that point is extended to form the phototransistor, the next step involves applying an emitter layer in the form of a semiconductor layer of the second conductivity type, for example in the form of polycrystalline silicon. The emitter layer is subsequently patterned in such a way that a preferably annularly closed emitter structure EM remains, which leaves uncovered a large part of the epitaxial layer within the light incidence window. Finally, an emitter contact is also produced above the emitter structure EM, said emitter contact being electrically insulated from the epitaxial layer ES.

Figure 7:
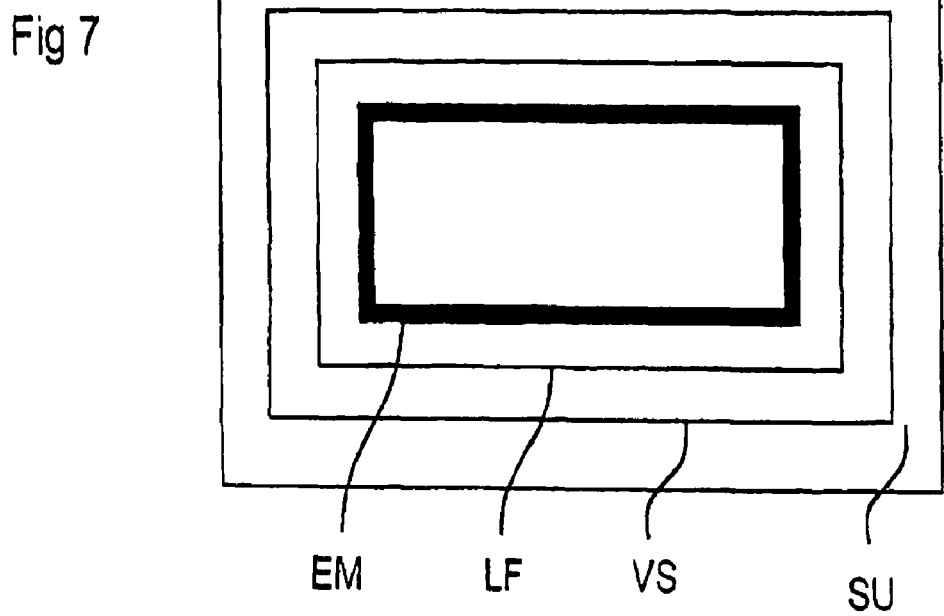
FIG. 7 shows a component that can be operated as a phototransistor in schematic plan view.

FIG. 7 shows, in a schematic plan view of the surface of a component formed as a phototransistor, a suitable dimensioning of the component parts of the component chosen by way of example. The size of the light incidence window LF is crucial for the area region in which light quanta can be trapped and absorbed in the component. The emitter structure EM is provided at a distance from the edge of the light incidence window LF, which emitter structure, as illustrated, may be embodied for example as a narrow band following the edge of the light incidence window. The layer VS buried in the semiconductor substrate SU has a larger extent than the light incidence window LF and additionally offers space for producing the substrate contact. The extent of the epitaxial layer is such that at least the light incidence window LF is completely covered by the epitaxial layer. However, the epitaxial layer is usually permitted to overlap the insulating layer outside the light incidence window. The substrate contact can accordingly also be arranged in a window within the epitaxial layer. The insulating layer IS can cover the entire surface of the substrate and is arranged below the epitaxial layer ES with area dimensioning at least equal in magnitude. The first contact for the connection of the connection zone is correspondingly also cut out or patterned in the insulating layer.

Figure 9:
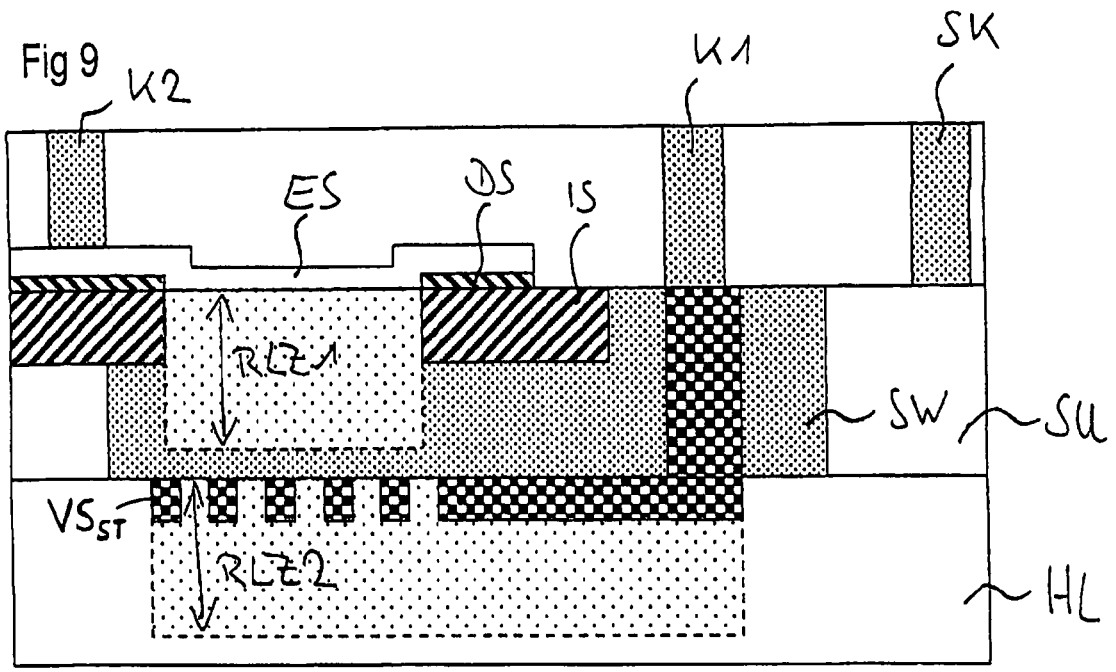
FIG. 9 shows a component comprising a second space charge zone and a patterned buried layer in schematic cross section.

FIG. 9 shows a completed component comprising a patterned buried layer $VS_{ST}$ in schematic cross section. This example has two significant differences compared with the embodiment in accordance with FIG. 1. The buried layer $VS_{ST}$ is patterned and the semiconductor substrate HL is contact-connected via a substrate contact SK at the surface, said substrate contact being arranged in a manner laterally offset with respect to the first space charge zone.

For operating a component in accordance with this exemplary embodiment, the second contact K2 and the substrate contact SK can be put at the same potential, for example at ground potential. Depending on the conductivity type assignment, the first contact is connected to a BIAS voltage in the reverse direction of the respective diode. If the buried layer or the substrate well is n-doped, the first contact is connected to a positive BIAS.

Figure 10:
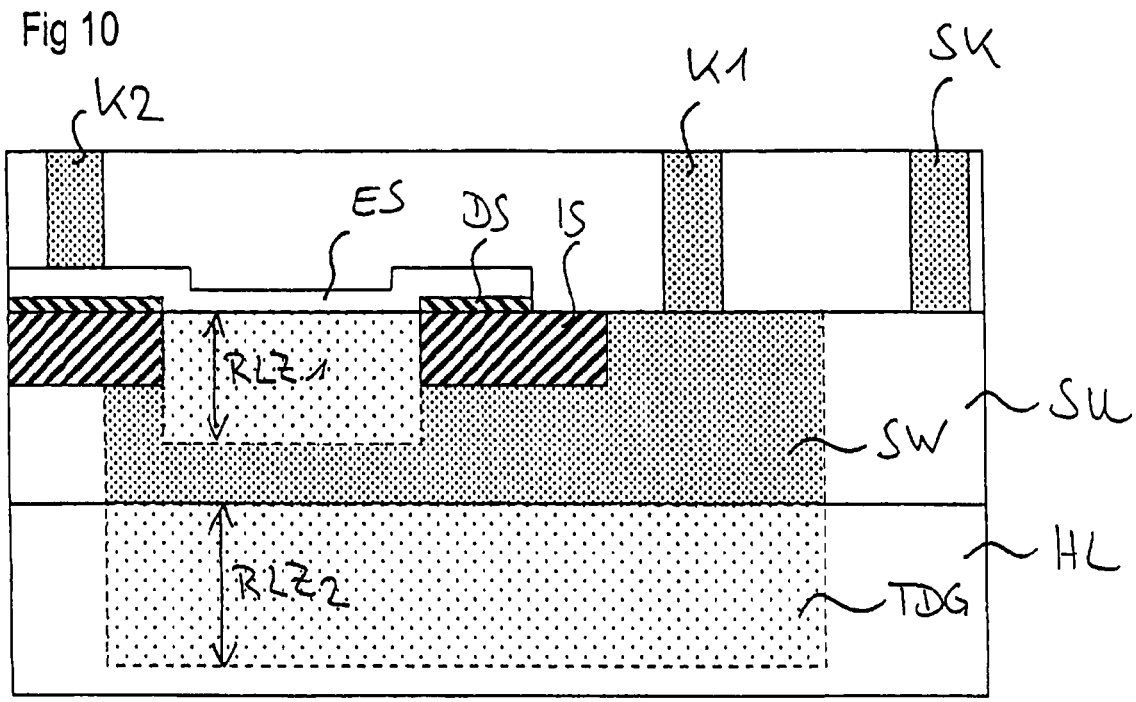
FIG. 10 shows a component comprising a second space charge zone and without a buried layer in schematic cross section.

FIG. 10 shows an exemplary embodiment comprising a first and a second space charge zone RLZ1, RLZ2, which can be formed without a patterned buried layer. The weakly doped semiconductor substrate HL of the first conductivity type is provided below the substrate well SW, and a second space charge zone can extend into said substrate. The substrate is connected outside and laterally offset with respect to the substrate well via a substrate contact SK. The substrate well can be connected via a first contact K1 without the doping of the substrate well having to be increased in this region for this purpose or without a highly doped connection zone having to be produced for this purpose. In this case, too, the second contact K2 and the substrate contact SK can be put at the same potential, while a bias voltage in the reverse direction is applied to the substrate well SW or the associated first contact K1, said bias voltage being positive, for example, if the substrate well is n-doped.

Figure 11:
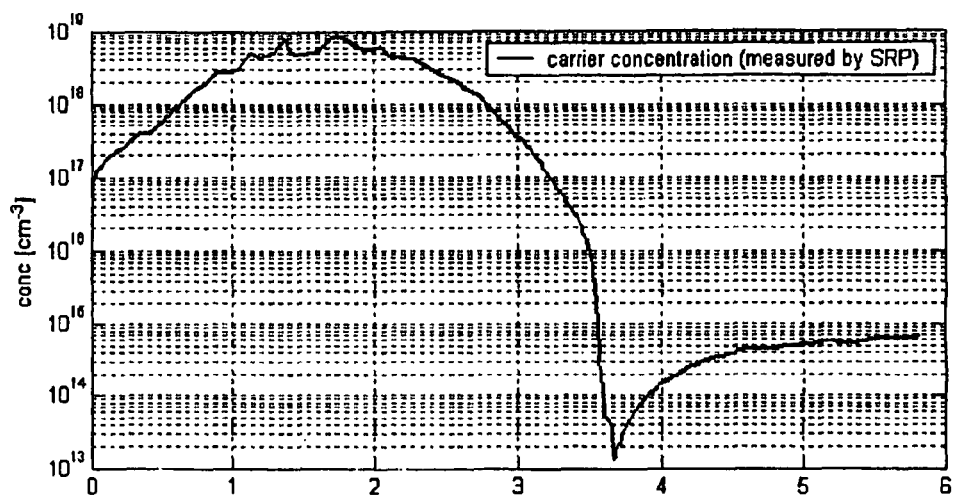
FIG. 11 shows the doping profile of the buried layer and of the semiconductor substrate in schematic cross section.
Figure 12:
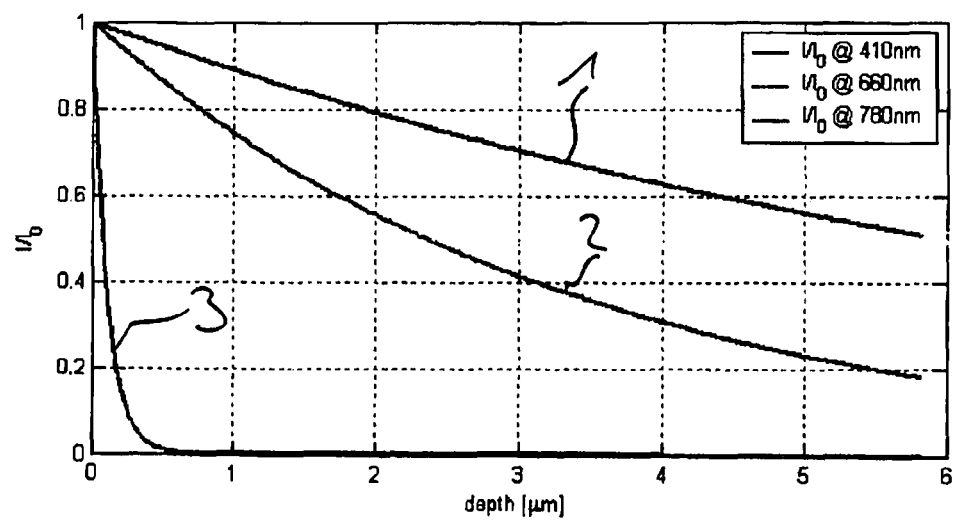
FIG. 12 shows the penetration depth of light in silicon as a function of the wavelength.

The improved mode of operation of a component according to the invention comprising a second space charge zone or comprising patterned buried layers becomes clear from FIGS. 11 and 12. FIG. 11 shows an exemplary doping profile for a buried layer known per se. Here this doping extends down to a depth of approximately 3.5 μm and has there a high content of more than $10^{16}$ impurities per $\mathrm{cm}^3$, wherein there is a high probability of recombination for generated charge carrier pairs.

FIG. 12 shows the penetration depths for light in silicon for three different wavelengths. Curve 1 corresponds to long-wave infrared light of approximately 780 nm, curve 2 corresponds to red light of approximately 660 nm and curve 3 corresponds to blue light of approximately 410 nm. It becomes clear that the penetration depth increases as the wavelength increases. If this is compared with the extent of the buried layer, then it becomes clear that a large part of the light radiated in for infrared light (curve 1) and a not inconsiderable proportion for red light (curve 2) is absorbed in the region of the buried layer. With a buried layer patterned according to the invention, a high proportion of the charge carriers generated there can be accumulated without premature recombination and the efficiency in charge carrier accumulation can thus be considerably improved. In order to produce a component according to the invention, it is possible to resort to the photomask steps used for the production of a bipolar transistor, with the result that there are no differences compared with the course of the process during the production of a bipolar transistor. The component can merely be optimized with regard to its dopings and layer thicknesses to the requirements for absorbing and for conducting away light quanta. However, it is also possible for the component according to the invention to be completely integrated into the bipolar process, with the result that bipolar transistors and components according to the invention can be produced on one wafer in parallel by means of the same steps and under identical conditions. This can be done without losses in the performance of one of the two component types.

The ratio of the area $A_e$ of the emitter structure to the area of the light incidence window, which corresponds to the area of the base $A_b$ in the photo-transistor, can be optimized in accordance with the following equation:

$$A_b/A_e = \frac{J_s \cdot \exp(U_b/U_t)}{\beta \cdot e \cdot \varphi}$$

where $J_s$ corresponds to the saturation current density of the transistor, $U_b$ is the base voltage, $U_t$ denotes k×T/Q, that is to say the voltage equivalent of thermal energy, $\beta$ corresponds to the current gain factor of the transistor $I_c/I_b$, e is the elementary charge and $\varphi$ is the incident photon flux that is converted into electron/hole pairs.

If the relative area of the emitter structure in comparison with the size of the base (corresponds to the size of the light incidence window) is chosen in the manner just specified, then a suitable base voltage of approximately $U_b$=0.6 to 0.8 V is obtained. For the remaining method steps it is possible to carry out standard steps such as are known for example from WO 2004/049452 cited, the entire contents of which are hereby incorporated by reference.

The figures do not illustrate oxide layers or generally dielectric layers which are deposited on the surface of the component for the insulation of the individual current-conducting layers and in which only the corresponding openings for producing the desired contacts are provided. Thus, the emitter structure is also preferably produced in openings in an oxide layer applied above the epitaxial layer ES. Above the insulating oxide layer, the emitter structure can then continue to grow with a larger cross section, giving a T-shaped structure in cross section, as is also illustrated for example in FIG. 2.

The invention is also not restricted to the exemplary embodiments illustrated. In principle, the invention can also be embodied with other semiconductor materials. The patterning both in cross section and in terms of the area can be embodied differently than in the illustrations. Within a semiconductor substrate it is also possible for a multiplicity of corresponding components to be produced and interconnected with one another, an array of light-sensitive components being obtained. On account of the identical production process, the components can also be produced with bipolar transistors on common substrates and be interconnected with them in integrated fashion. In this way, it is possible to concomitantly integrate driving and logic circuits for operating the component and for processing the photosignals.

Although the component is optimized to the detection of the blue spectrum of visible light, it is also suitable for detecting light having a different wavelength. The dopant of the first conductivity type is preferably p-doping. However, it is also possible to produce the epitaxial layer in n-doped fashion. In the epitaxial layer, a germanium gradient with a germanium content that increases downward toward the semiconductor substrate can also be embodied alongside the gradient for the dopant of the first conductivity type.

A component that can be operated as a photodiode can also be operated as an avalanche photodiode. In this case, a BIAS voltage dimensioned to be high enough that it can trigger the "avalanche effect" in the event of light incidence is applied to the first and second contacts, that is to say to the substrate and the epitaxial layer.

The figures likewise do not illustrate antireflective coatings which are optionally possible and which, for example, can also be applied as topmost layers to the constructions illustrated. In principle, however, it is also possible to apply such antireflective layers below the oxide insulation directly on the corresponding topmost semiconductor layer. For such antireflective layers it is possible to use materials that are transparent to the light to be detected and have a thickness of a quarter of the optical wavelength that can propagate in the layer.

If the epitaxial layer is electrically connected, as is possible during operation as a diode or in individual cases during operation as a phototransistor, then the electrical series resistance of the epitaxial layer can be increased outside the light incidence window by subsequent doping and, in particular, by implantation. In this case, a mask which serves for the patterning of the emitter in the comparable bipolar transistor process can be used for protecting the epitaxial layer in the region of the light incidence window. Using said mask it is possible to pattern a protective resist or else a polysilicon layer as implantation resist during said implantation.

FIG. 8 shows, in each case illustrated on the right, various significant method stages in a variant for the production of the phototransistor which is advantageous owing to its compatibility, said method stages being compared with the matching method stages that can be carried out in parallel during the production of a bipolar transistor (in each case illustrated on the left).

Figure 8A:
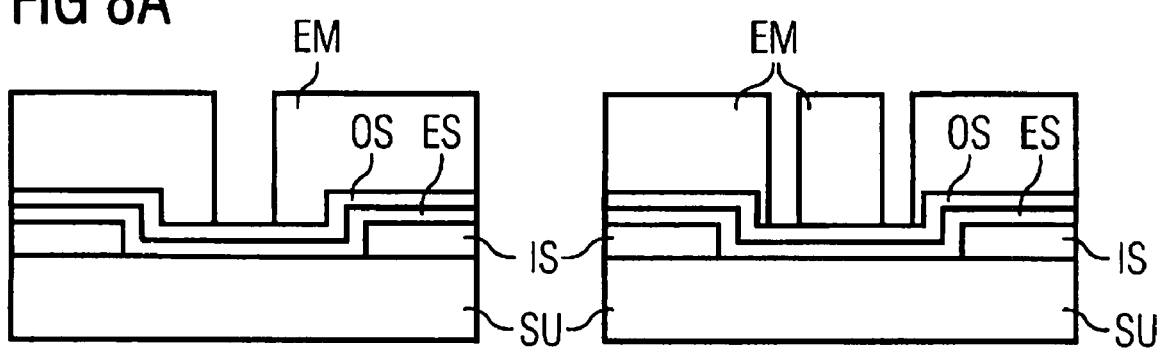
FIG. 8 shows parallel and corresponding method steps during the production of a known bipolar transistor and of a phototransistor according to the invention in schematic cross section.

FIG. 8A begins after the production of a dielectric layer OS above the epitaxial layer ES. The structures produced underneath are identical for both component types, with the exception of, if appropriate, differently chosen two-dimensional dimensions or patternings, for example of the buried layer. The emitter mask EFM is then produced in order to uncover the base (epitaxial layer ES) in an emitter window. In accordance with the reduced size of the emitter structure in the case of the phototransistor, the mask is closed in the center there.

Figure 8B:
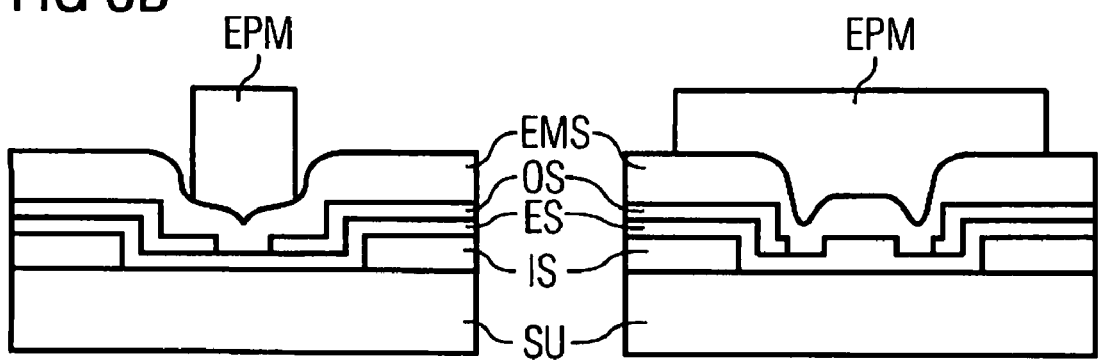

Afterward, the dielectric layer OS is etched away and a polysilicon layer is applied as emitter layer EMS over the whole area. FIG. 8B shows the construction after application of a further mask EPM (emitter poly mask) for the patterning of the emitter layer EMS.

Figure 8C:
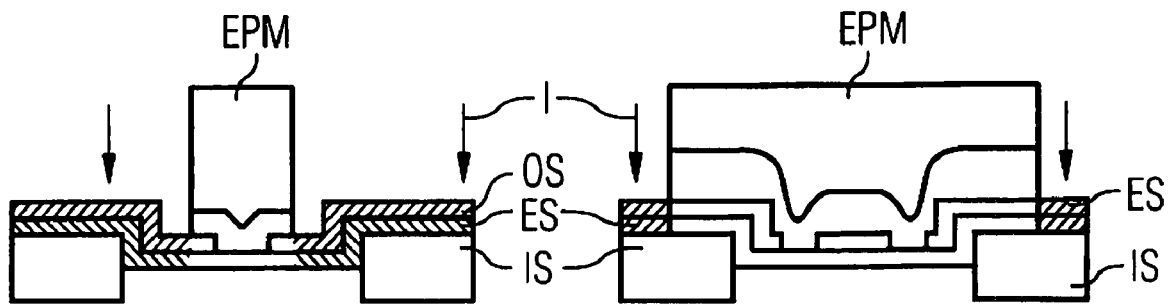

The arrangement illustrated in FIG. 8C remains after the etching of that region of the emitter layer EMS which is not covered by the mask EPM. In the case of the bipolar transistor, only the component region required for the application of an emitter contact remains, as known. In the case of the phototransistor, by contrast, a much larger region of the emitter layer remains.

In both component types, a base implant I is then carried out, wherein those regions of the epitaxial layer ES which are not covered by the emitter poly mask EPM are doped relatively highly through the dielectric layer OS. In the case of the bipolar transistor, this doping almost directly adjoins the active base, whereas this is effected only at a larger distance in the case of the phototransistor. In the case of the bipolar transistor, a high doping and thus low-impedance behavior at the base connection is desired. This is avoided in the case of the phototransistor, by contrast, since an implantation or indiffusion of dopant into the active region of the phototransistor can produce impurities there which can lead to the intensified recombination of charge carrier pairs and thus to a reduced photosensitivity.

Figure 8D:
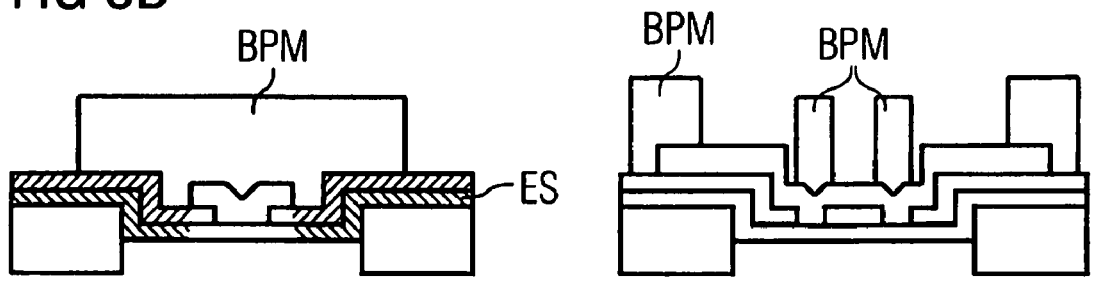

Afterward, as shown in FIG. 8D, the mask EPM is replaced by the base poly mask BPM, which is to be used to remove the base (epitaxial layer ES) outside the area required for the transistors. In the case of the phototransistor, the emitter layer EMS is additionally also patterned using said mask. Thus, proceeding from the arrangement according to FIG. 8D, firstly an oxide etch is carried out, by means of which, in the case of the bipolar transistor, the base (epitaxial layer ES) is etched and, in the case of the phototransistor, oxide situated thereabove, if appropriate, is etched. The uncovered regions of the emitter layer EMS (only in the case of the phototransistor) and also of the base (epitaxial layer ES) in the case of the bipolar transistor are subsequently removed. A further oxide etch ensues, by means of which the epitaxial layer is uncovered in the case of the phototransistor. The bipolar transistor is protected by sufficiently thick insulating layers IS, e.g. by a field oxide, at the uncovered regions alongside the base poly mask BPM.

Figure 8E:
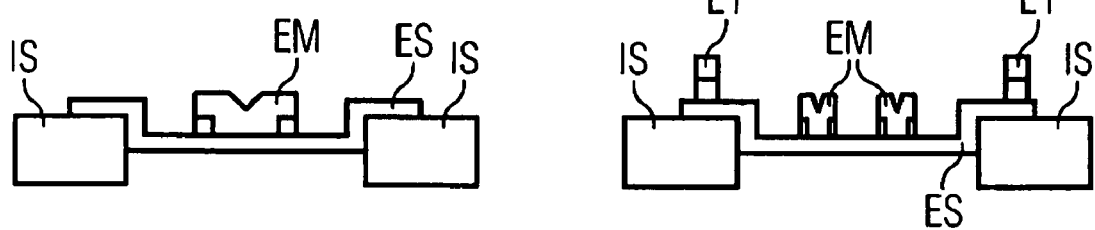

FIG. 8E shows the structures thus obtained after these patternings. In the case of the phototransistor, there remains directly alongside that region of the epitaxial layer which is doped relatively highly by the implantation in FIG. 8C (connection zone of the epitaxial layer) an unrequired structure residue E1 composed of dielectric layer and emitter layer, which is solely owing to a tolerance that has to be taken into consideration owing to the inaccuracy during alignment of the base poly mask BPM relative to the emitter mask EFM.

Using the same method as in the case of the photo-transistor, it is also possible to produce a photodiode without emitter structures if, in FIG. 8A, no openings are provided in the emitter mask EFM above the photodiode. In the case of the base poly mask BPM, the two inner mask structures which pattern the emitter structures EM of the phototransistor are then omitted, such that the emitter layer can be completely removed there.

The phototransistor can advantageously also be operated at an operating point at which a specific base current or collector current flows. This can be dimensioned such that a particularly rapid charge reversal of the internal capacitances of the transistor (emitter/base capacitance and base/collector capacitance) is possible. The transition rate of the phototransistor can thus be increased. The response and decay times of the component are shortened, faster clocking of the transistor is possible and it can resolve a higher frequency of pulsed light quanta, which is particularly well suited to use for information and communications technology.

For the transition frequency Ft of a bipolar transistor and correspondingly also of the phototransistor, the following holds true in small-signal behavior:

$$Ft = 1/[2\pi*(\tau + KT/q*I_c(C_{EB}+C_{BC}))]$$

where
$\tau$=forward transit time
$q/KT$=voltage equivalent of thermal energy
$C_{EB}$=emitter/base capacitance
$C_{BC}$=base/collector capacitance
$I_C$=collector current.

An optimum operating point in this regard is obtained if the transition frequency Ft in accordance with the above equation is set in maximal fashion. This is achieved by means of a collector current $I_c$ that is set to be as low as possible.

The invention claimed is:

1. A light-sensitive component comprising:
   a component body, comprising:
   a lightly doped semiconductor substrate,
   an insulating layer bearing on the semiconductor substrate;
   a light incidence window in the insulating layer;
   a substrate well doped with dopant of a second conductivity type arranged in the semiconductor substrate in a region of the light incidence window;
   an epitaxial layer arranged on the surface of the semiconductor substrate at least in the light incidence window, said epitaxial layer being entirely doped with a dopant of a first conductivity type; and
   a semiconductor junction between the epitaxial layer and the well doping;
   wherein the layer thickness of the epitaxial layer doped with the dopant of the first conductivity type is less than 80 nm.

2. The component as claimed in claim 1, in which the epitaxial layer has a doping of a surface charge density of more than $6.6*10^{11}$ cm$^{-2}$.

3. The component as claimed in claim 1, which has a depletion region around the semiconductor junction with a thickness of more than 50 nm.

4. The component as claimed in claim 1, in which the semiconductor substrate and the epitaxial layer, independently of one another, comprise at least one semiconductor composed of Si, SiGe or Ge.

5. The component as claimed in claim 1, in which a buried layer highly doped with a dopant of the second conductivity type is arranged in the semiconductor substrate below the substrate well.

6. The component as claimed in claim 5, in which a connection zone highly doped with a dopant of the second conductivity type and extending to the surface of the component body is provided outside the region lying below the light incidence window, which connection zone connects the buried layer to a contact on the surface in low-impedance fashion.

7. The component as claimed in claim 6, in which an insulating layer is arranged between the semiconductor substrate and the epitaxial layer outside the light incidence window;
   in which the epitaxial layer has a higher doping outside the light incidence window above the insulating layer than in the region of the light incidence window, or is in direct contact with a highly doped layer there;
   in which a further electrical contact is provided as connection for the epitaxial layer outside the light incidence window; and
   in which, in the event of light incidence, it is possible to measure a photocurrent between a first contact, which is connected to the semiconductor substrate in the highly doped connection zone, and the further contact.

8. The component as claimed in claim 5, in which the doping of the buried highly doped layer is formed in strip-type or lattice-type fashion.

9. The component as claimed in claim 8, in which the doping of the buried layer formed in strip-type fashion is oriented such that a low impedance connection to the connection zone is produced by the doping.

10. The component as claimed in claim 1, in which the semiconductor substrate has a basic doping of the first conductivity type.

11. The component as claimed in claim 1, in which the doping of the epitaxial layer has a gradient and decreases downward toward the semiconductor substrate.

12. The component as claimed in claim 1, in which the epitaxial layer comprises SiGe, wherein the germanium content increases downward toward the semiconductor substrate.

13. The component as claimed in claim 1, in which, alongside a respective contact at the epitaxial layer and at the substrate well or at the connection zone, a substrate contact is also provided at the lightly doped semiconductor substrate.

14. The component as claimed in claim 1, in which an emitter structure is arranged above the epitaxial layer in an edge region of the light incidence window.

15. The component as claimed in claim 14, in which the emitter structure is arranged centrally above the light incidence window or follows the edge of the light incidence window, is closed in annular fashion and comprises polysilicon doped with a dopant of the second conductivity type.

16. The component as claimed in claim 14,
in which a second electrical contact is provided at the emitter structure, and
in which, in the event of light incidence, it is possible to measure a photocurrent between a first contact, which is connected to the semiconductor substrate in a highly doped connection zone, and the second contact.

17. The component as claimed in claim 14, in which a BIAS voltage is present between the emitter structure and the substrate well or the buried layer.

18. The component as claimed in claim 1, in which a BIAS voltage is present between the epitaxial layer and the substrate well or the buried layer.

19. The component as claimed in claim 18, in which a BIAS voltage is present between the substrate well or the buried layer and the further contact at the substrate.

20. The component as claimed in claim 18, in which the thickness of the intrinsic layer of the PIN or NIP structure is dimensioned such that all light quanta of a wavelength to be detected are still absorbed within the intrinsic layer.

21. The component as claimed in claim 1, in which the highly doped epitaxial layer has a layer thickness of 50 nm or less.

22. The component as claimed in claim 1, in which an antireflective coating is provided on the light incidence side of the component.

23. The component as claimed in claim 1, in which the semiconductor body together with the epitaxial layer has a PIN or NIP structure.

24. A method for producing a component as claimed in claim 1, in which the component and a bipolar transistor are produced on a common wafer and in parallel, wherein the mask steps are adapted such that no additional mask steps are required in comparison with the production of the bipolar transistor by itself; and wherein the mask for patterning the emitter in the case of the bipolar transistor and emitter structures of a phototransistor are used as an implantation mask for doping the epitaxial layer.

25. The method as claimed in claim 24, in which a buried layer in the form of a strip- or lattice-type doping is produced in the semiconductor substrate, and
in which a doped substrate well having the same strip- or lattice-type doping is produced in the semiconductor substrate above the buried layer by carrying out an implantation by means of a corresponding mask.

26. A method for detecting the light thereof and for reading out optically coded data with a component as claimed in claim 1 in combination with a blue light emitting diode.

* * * * *

UNITED STATES PATENT AND TRADEMARK OFFICE
CERTIFICATE OF CORRECTION

PATENT NO. : 8,227,882 B2  
APPLICATION NO. : 11/884805  
DATED : July 24, 2012  
INVENTOR(S) : Hubert Enichlmair et al.

Page 1 of 1

It is certified that error appears in the above-identified patent and that said Letters Patent is hereby corrected as shown below:

On the title page:

Item (73)   Assignee: should read as follows:   austriamicrosystems AG, Unterpremstätten [[(DE)]] AT Signed and Sealed this  
Fifth Day of August, 2014

Michelle K. Lee  
*Deputy Director of the United States Patent and Trademark Office*